United States Patent
Questad et al.

(10) Patent No.: US 7,732,894 B2
(45) Date of Patent: Jun. 8, 2010

(54) ELECTRONIC COMPONENTS ON TRENCHED SUBSTRATES AND METHOD OF FORMING SAME

(75) Inventors: David Questad, Hopewell Junction, NY (US); Vijayeshwar D. Khanna, Millwood, NY (US); Jennifer V. Muney, Ridgefield, CT (US); Arun Sharma, New Rochelle, NY (US); Sri M. Sri-Jayantha, Ossining, NY (US); Lorenzo Valdevit, Ithaca, NY (US)

(73) Assignee: International Business Machines Corporation, Armonk, NY (US)

( * ) Notice: Subject to any disclaimer, the term of this patent is extended or adjusted under 35 U.S.C. 154(b) by 9 days.

(21) Appl. No.: 12/030,274

(22) Filed: Feb. 13, 2008

(65) Prior Publication Data

US 2009/0085161 A1    Apr. 2, 2009

Related U.S. Application Data

(63) Continuation of application No. 11/679,407, filed on Feb. 27, 2007.

(51) Int. Cl.
*H01L 23/48* (2006.01)
(52) U.S. Cl. .............................. 257/532; 257/E23.026; 257/E23.144

(58) Field of Classification Search ................. 257/532, 257/E23.026, E23.144
See application file for complete search history.

(56) References Cited

U.S. PATENT DOCUMENTS

| 5,739,186 | A | 4/1998 | Hayakawa et al. |
| 6,939,737 | B2 | 9/2005 | Palanisamy |
| 2002/0027763 | A1 | 3/2002 | Schaper |
| 2002/0071256 | A1 | 6/2002 | Figueroa et al. |
| 2002/0145197 | A1 | 10/2002 | Ohta et al. |
| 2003/0219956 | A1 | 11/2003 | Mori et al. |
| 2004/0021197 | A1 | 2/2004 | Oh et al. |
| 2004/0022038 | A1 | 2/2004 | Figueroa et al. |

FOREIGN PATENT DOCUMENTS

DE     195 40 814 A1   5/1997

*Primary Examiner*—M. Wilczewski
*Assistant Examiner*—Toniae M Thomas
(74) *Attorney, Agent, or Firm*—McGinn IP Law Group PLLC; Vazken Alexanian

(57) ABSTRACT

A method of mounting an electronic component on a substrate includes forming at least one trench in a surface of the substrate. The trenches formed in the substrate reduce a stiffness of the substrate, which provides less resistance to shear. Accordingly, the trenches reduce the amount of strain on the joints, which mount the electronic component to the substrate, which enhances the life of the joints.

20 Claims, 10 Drawing Sheets

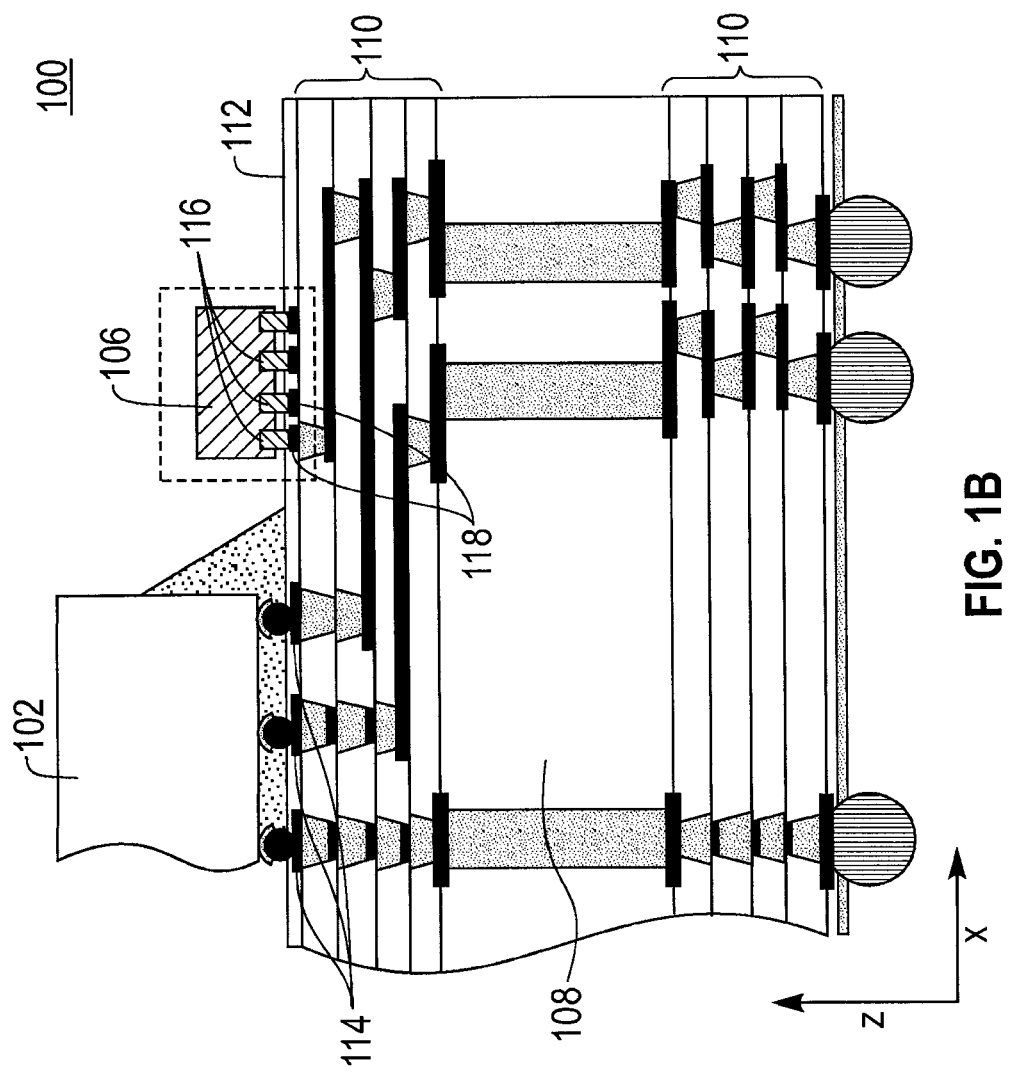
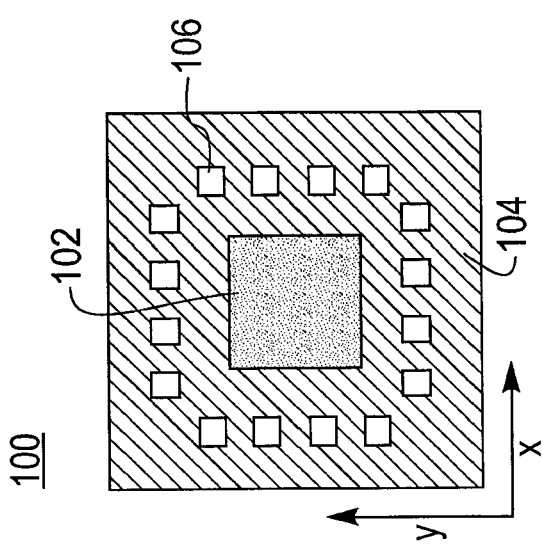
FIG. 1A
FIG. 1B

ELECTRONIC COMPONENTS ON TRENCHED SUBSTRATES AND METHOD OF FORMING SAME

BACKGROUND OF THE INVENTION

The present application is a Continuation Application of U.S. patent application Ser. No. 11/679,407 filed on Feb. 27, 2007.

FIELD OF THE INVENTION

The present invention generally relates to a method and apparatus for surface-mounting capacitors on electronic (organic) substrates, and more particularly to a method and apparatus for reducing strain in a surface-mounted component.

DESCRIPTION OF THE RELATED ART

Electronic components, such as capacitors, are typically mounted on a substrate. For example, as illustrated in FIG. 1A, a chip 102 is mounted on a surface of a substrate 104. A plurality of capacitors 106, or other discrete electronic devices, is mounted on the surface of the substrate 104, surrounding the chip 102.

FIG. 1B illustrates a detailed description of the electronic module 100, depicted in FIG. 1A.

Typically, the substrate 104 is formed by first forming the core 108. An entire thickness of the substrate 104 may typically be, approximately 1 mm thick. Next, build-up layers 110 are formed on each of a top surface and a bottom surface of the core 108. The build-up layers typically include polymer and copper layers.

A solder mask 112 is then formed on a surface of the substrate 104. The solder mask 112 covers the substrate, except areas where it is desired to make a solder connection.

The chip (e.g., silicon chip) 102 is mounted to the substrate 104 through solder joints 114. Similarly, the capacitor 106, or other surface mount component, is mounted to the substrate by solder joints 116 and pads 118.

Capacitors that are mounted on a substrate, in accordance with the above description, however, may undergo significant thermomechanical strain. Temperature cycling produces fatigue of the solder joints or cracks in the ceramic plates of the capacitor. Accordingly, the life of the electronic package is reduced.

The electronic module is subjected to thermal cycling to evaluate the robustness of the electronic joints. FIG. 2 illustrates the sources of strain on a surface-mounted component during the thermal cycling.

First, shear stress 208 is induced in the solder joints 202, which mount the capacitor 204 to the substrate 206. The shear stress on the solder joints 202 is caused by a mismatch in coefficient of thermal expansion of the capacitor 204 and the substrate 206. Typically, the coefficient of thermal expansion for the capacitor 204 may be on the order of approximately 3 ppm, while the coefficient of thermal expansion of the substrate 206 may be on the order of approximately 20 ppm.

FIG. 3 illustrates the degree of stress 208 on the solder joints 202, the capacitor 204 and the substrate 206. The stress may also produce cracks in the substrate 206.

FIG. 4 illustrates two types of strain induced on the solder joints during thermal cycling. Both Von Mises stress and shear strain are induced on the solder joints.

Returning to FIG. 2, the mismatch in coefficient of thermal expansion also causes the substrate 206 to bend. The bending of the substrate 206 produces a tension/compression stress 210 on the solder joints 202. Additionally, while the bending may reduce the shear stress 208 on the solder joints 202, it will cause an increase in the stress placed on the capacitor 204.

Furthermore, the solder joints 202 have a coefficient of thermal expansion, which may be different from the coefficient of thermal expansion of the capacitor 204 and/or the substrate 206. This mismatch in coefficient of thermal expansion causes a localized, complex stress state 212 on the solder joints 202.

Additionally, the stress at the solder joint areas permeates the body of the electronic components, which can produce cracks that may result in functional failure.

Accordingly, prior to the present invention, there has been no method of surface mounting an electronic component, such as a capacitor, onto a substrate while reducing the effects of stress on the joints, the capacitor and the substrate.

SUMMARY OF THE INVENTION

In view of the foregoing and other exemplary problems, drawbacks, and disadvantages of the conventional methods and structures, an exemplary feature of the present invention is to provide a method and structure in which strain is reduced in a surface-mounted electronic component.

In accordance with a first aspect of the present invention, a method of mounting an electronic component on a substrate includes forming at least one trench in a surface of the substrate.

In accordance with a second aspect of the present invention, an electronic module includes a substrate having at least one trench formed in a surface of the substrate.

In accordance with a third aspect of the present invention, an electronic substrate includes at least one trench in a surface of the electronic substrate.

Forming trenches in a surface of the electronic substrate reduces the stiffness of the substrate in the vicinity of a capacitor (or any other electronic component), so that the substrate has less resistance to shear. Accordingly, the strain on the joints, which mount the electronic component onto the substrate, is reduced, which enhances the life of the joints.

BRIEF DESCRIPTION OF THE DRAWINGS

The foregoing and other exemplary purposes, aspects and advantages will be better understood from the following detailed description of an exemplary embodiment of the invention with reference to the drawings, in which:

FIGS. 1A and 1B illustrate an electronic module 100 including a surface-mounted capacitor 106 mounted according to a conventional mounting technique;

DETAILED DESCRIPTION OF EXEMPLARY EMBODIMENTS OF THE INVENTION

Figure 2:
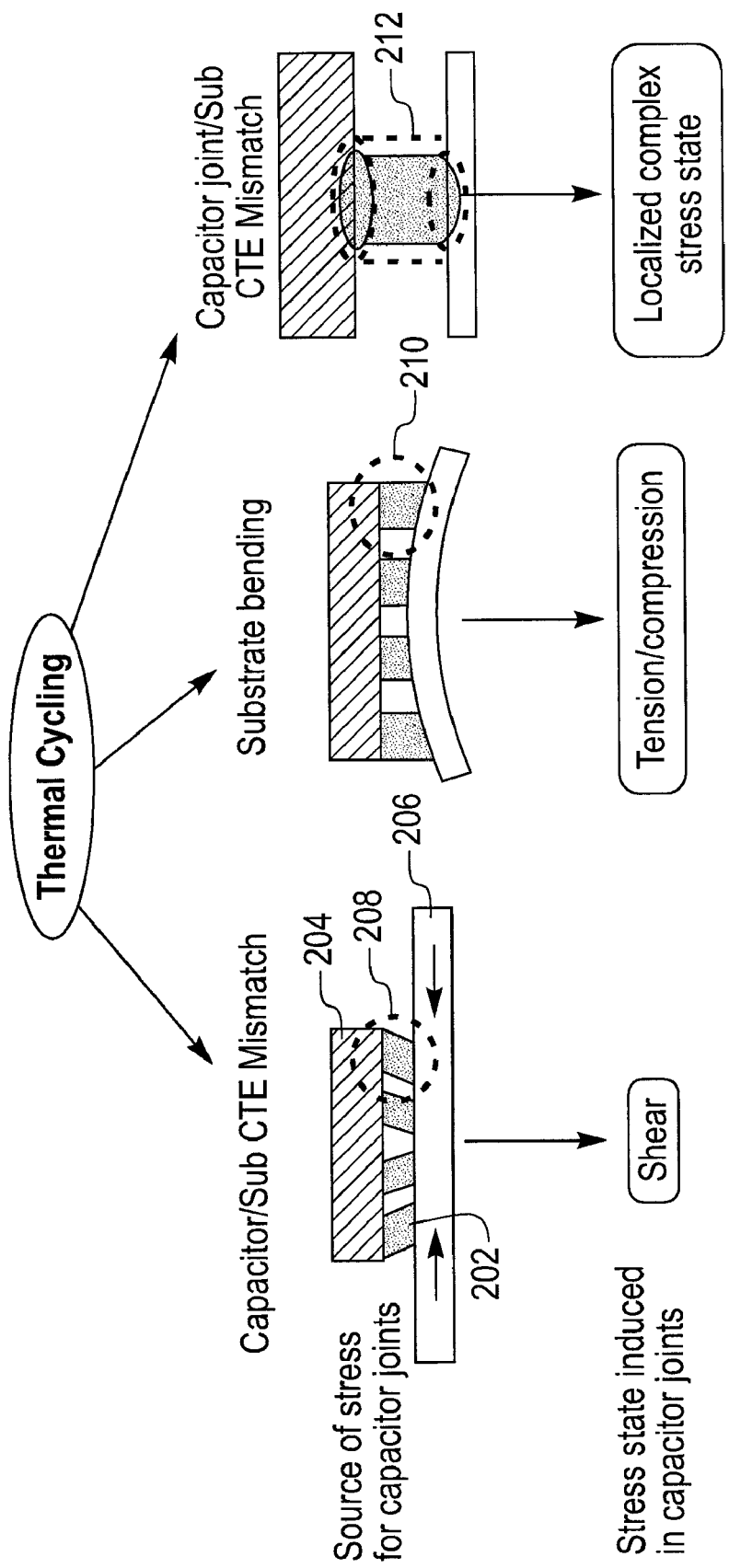
FIG. 2 illustrates typical stresses induced in solder joints 202 of a conventional surface-mounted capacitor 204.
Figure 3:
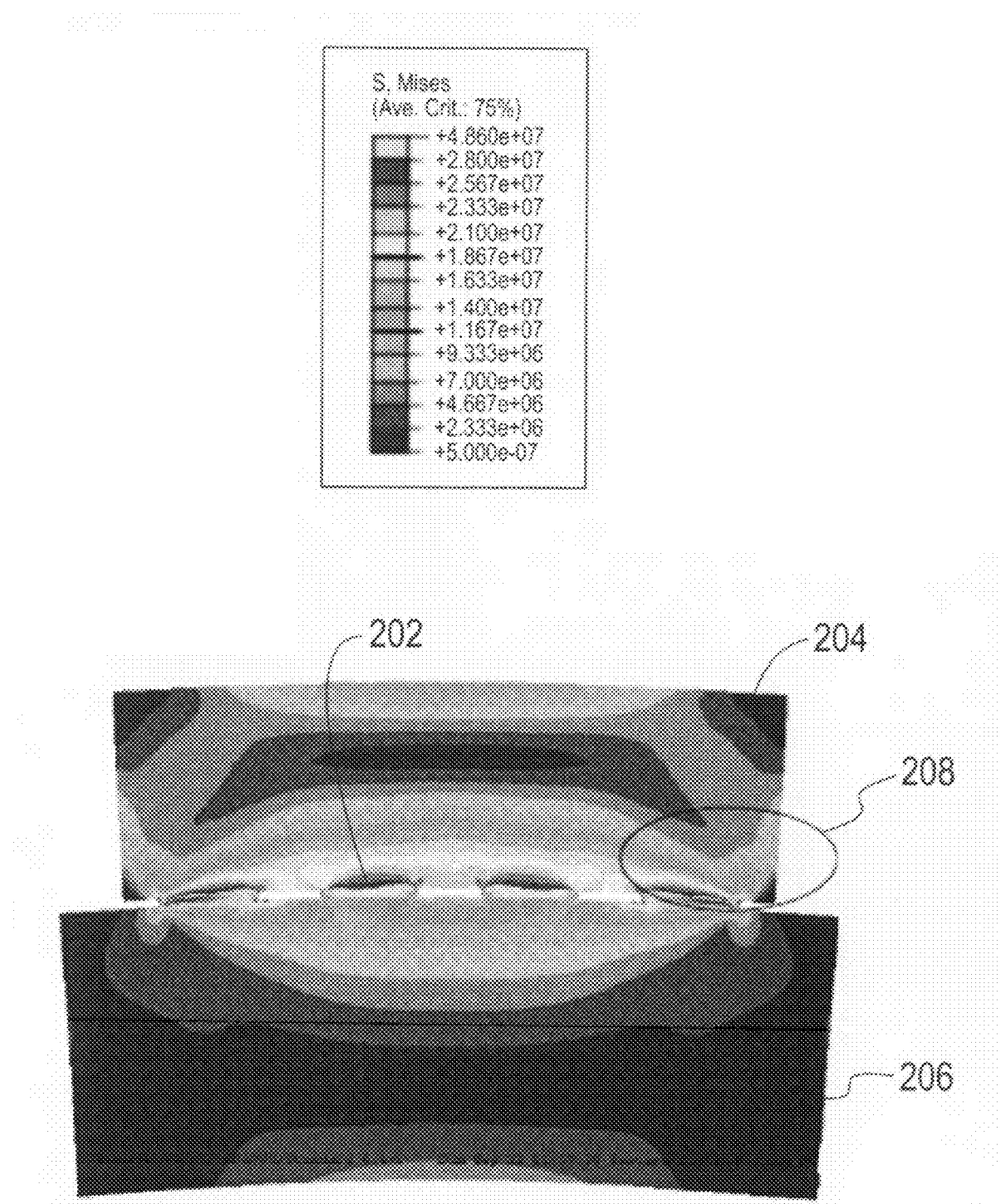
FIG. 3 further illustrates the stress induced on a conventional surface-mounted capacitor.
Figure 4:
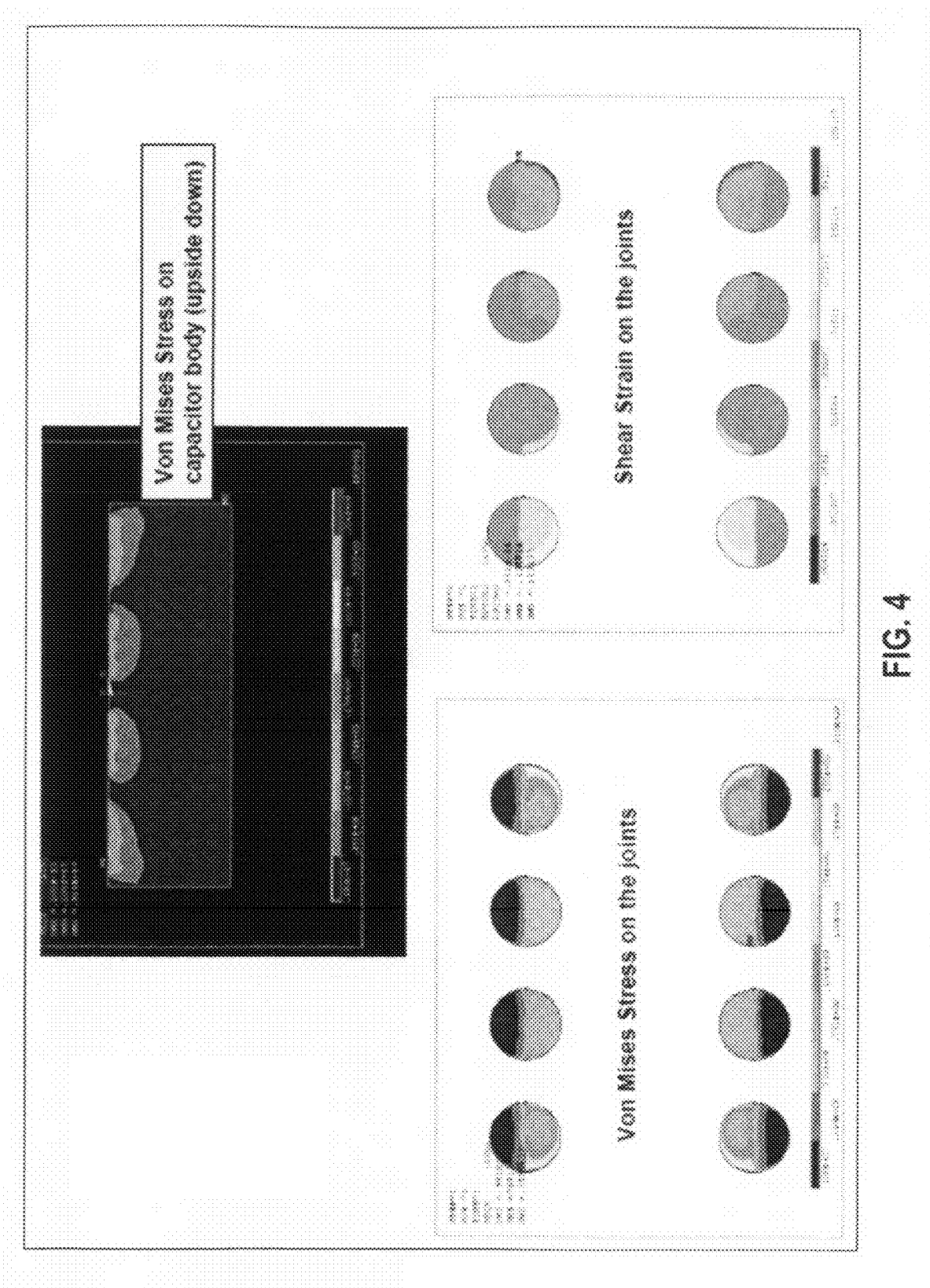
FIG. 4 further illustrates the stress induced on a conventional surface-mounted capacitor.

Referring now to the drawings, and more particularly to FIGS. 5-10, there are shown exemplary embodiments of the method and structures according to the present invention.

Figure 5:
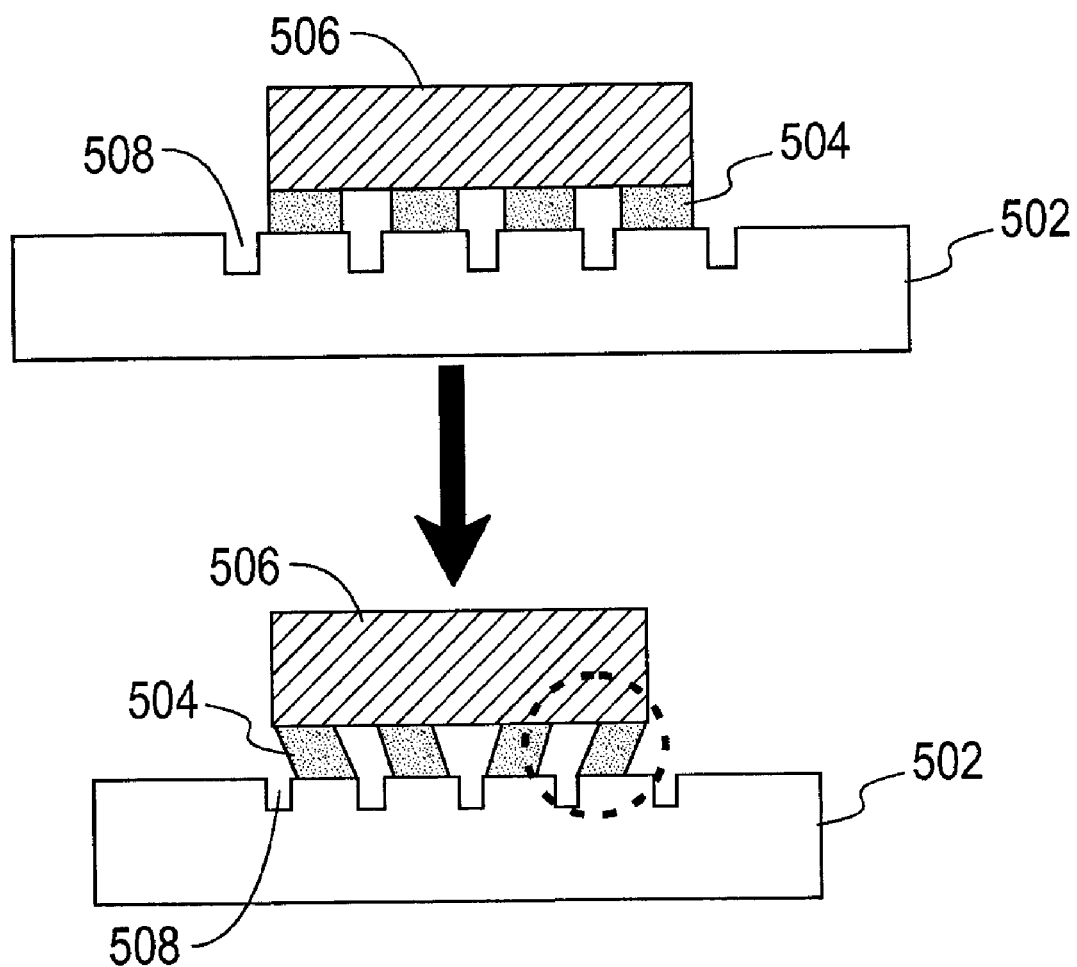
FIG. 5 illustrates an exemplary trenched substrate 502 in accordance with an exemplary embodiment of the present invention.

FIG. 5 illustrates an exemplary electronic module 500 in accordance with an exemplary embodiment of the present invention. The electronic module includes a substrate 502 having an electronic component (e.g., capacitor) 506 mounted on a surface of the substrate 502. The capacitor 506 is mounted on the substrate 502 through joints (e.g., solder joints) 504.

In accordance with certain exemplary aspects of the present invention, at least one trench 508 is formed in a surface of the substrate 502. By forming a trench 508 in a surface of the substrate 502, a stiffness of the substrate 502 is reduced. Reducing the stiffness of the substrate 502 reduces the substrate's 502 resistance to shear forces. Accordingly, the stress induced on the substrate 502 and the solder joints 504 is reduced. Therefore, the life of the solder joints 504 is enhanced.

Figure 6:
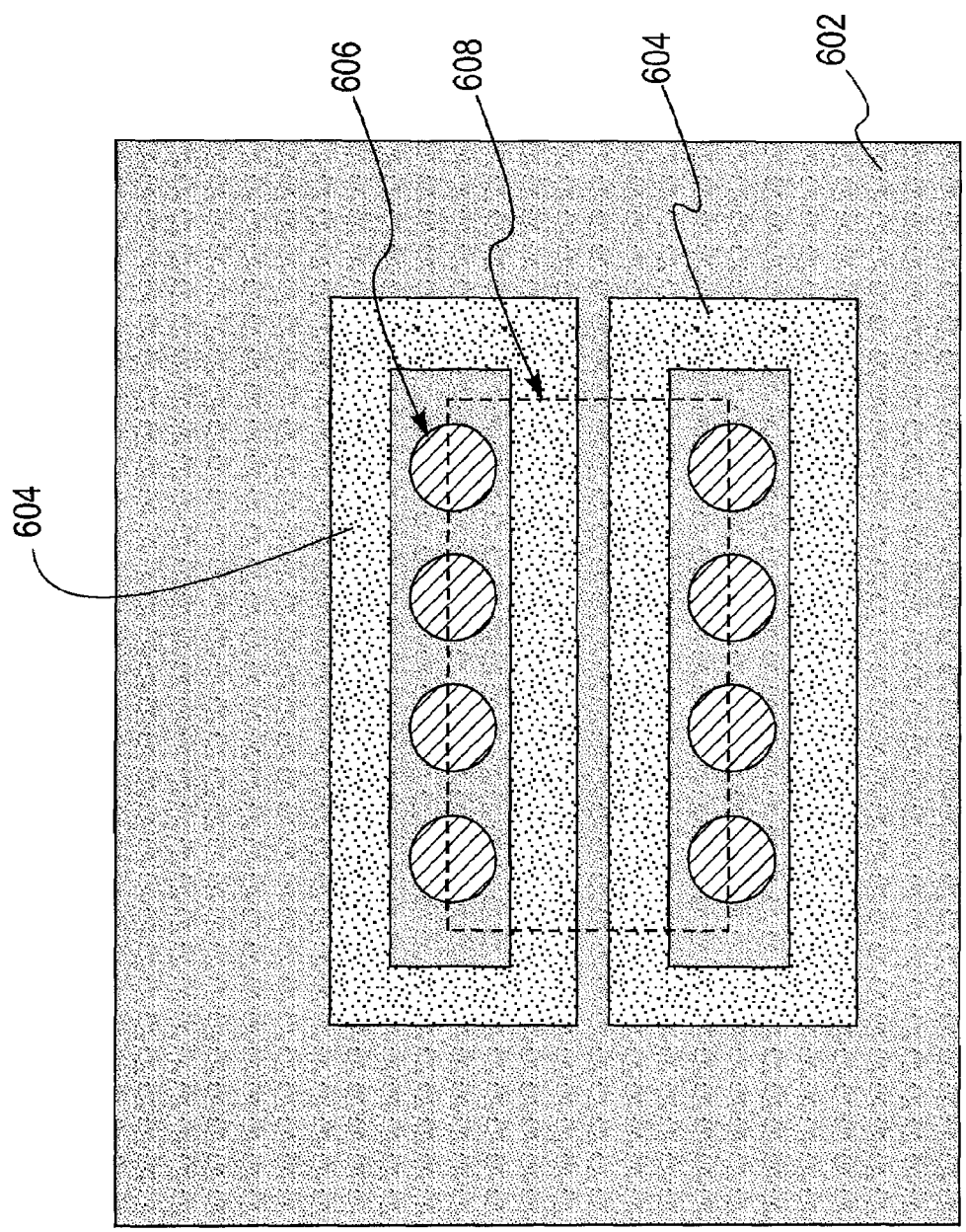
FIG. 6 illustrates a first trench design in accordance with an exemplary embodiment of the present invention.
Figure 7:
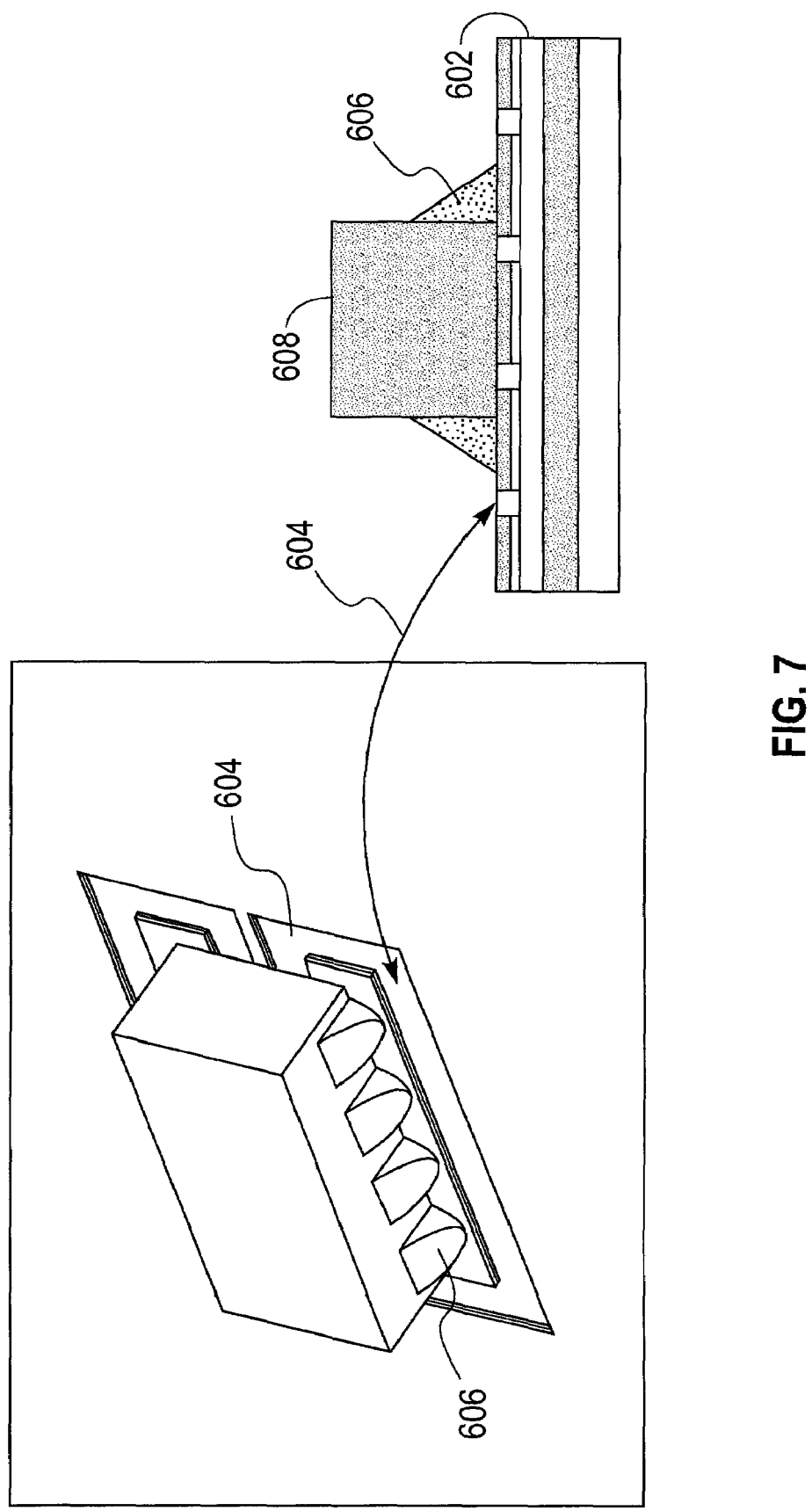
FIG. 7 illustrates a three-dimensional view of the trench design depicted in FIG. 6.

FIG. 6 illustrates a trench design in accordance with an exemplary embodiment of the present invention. FIG. 7 illustrates a three-dimensional view of the electronic module illustrated in FIG. 6.

As shown in FIG. 6, an electronic module 600 includes an electronic component (capacitor) 608 mounted on a substrate 602. The capacitor 608 is mounted to the substrate 602 by a plurality of capacitor legs (solder pads/solder joints) 606.

In accordance with the exemplary embodiment depicted in FIG. 6, the capacitor 608 is mounted to the substrate 602 by two rows of solder pads 606. A continuous trench 604 is formed around each row of solder pads 606. Each individual trench is approximately 15 µm deep and is approximately 200 µm wide.

Figure 8:
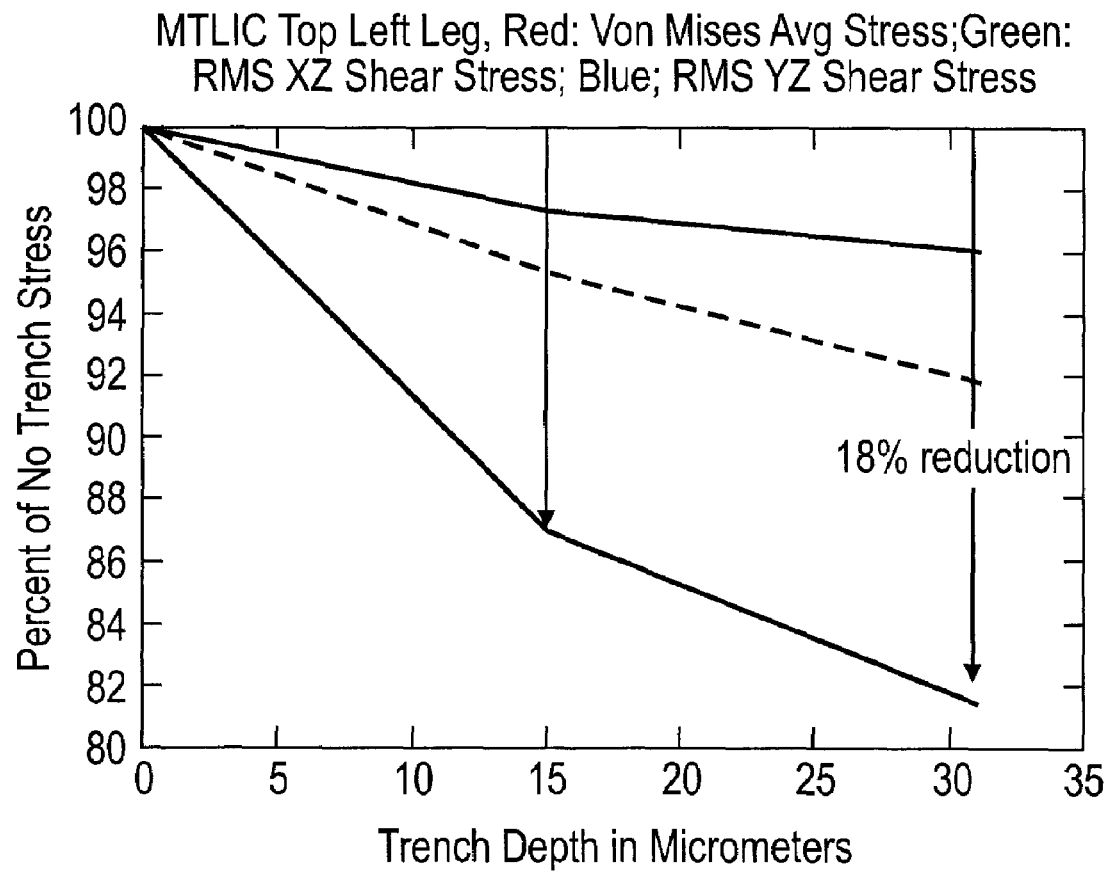
FIG. 8 graphically depicts the stress reduction resulting from the trenched substrate of the present invention.
Figure 8:
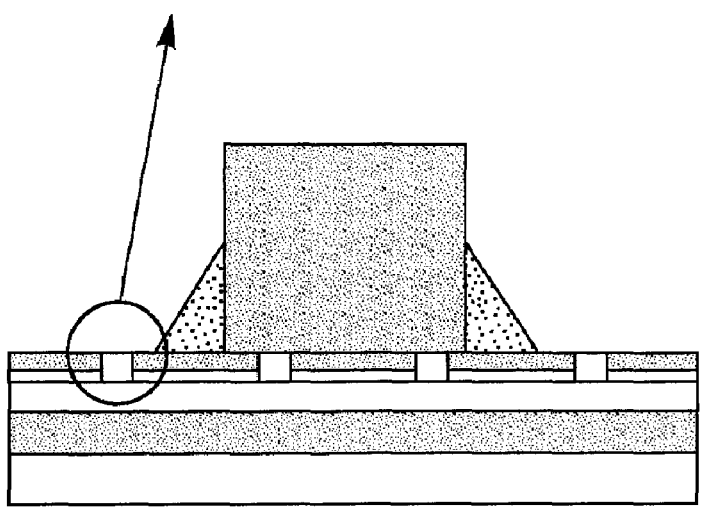

FIG. 8 is a graph depicting the reduction in stress achieved using the trench design illustrated in FIGS. 6 and 7. As indicated in FIG. 8, the trench design depicted in FIGS. 6 and 7 provides an 18% reduction stress.

Figure 9:
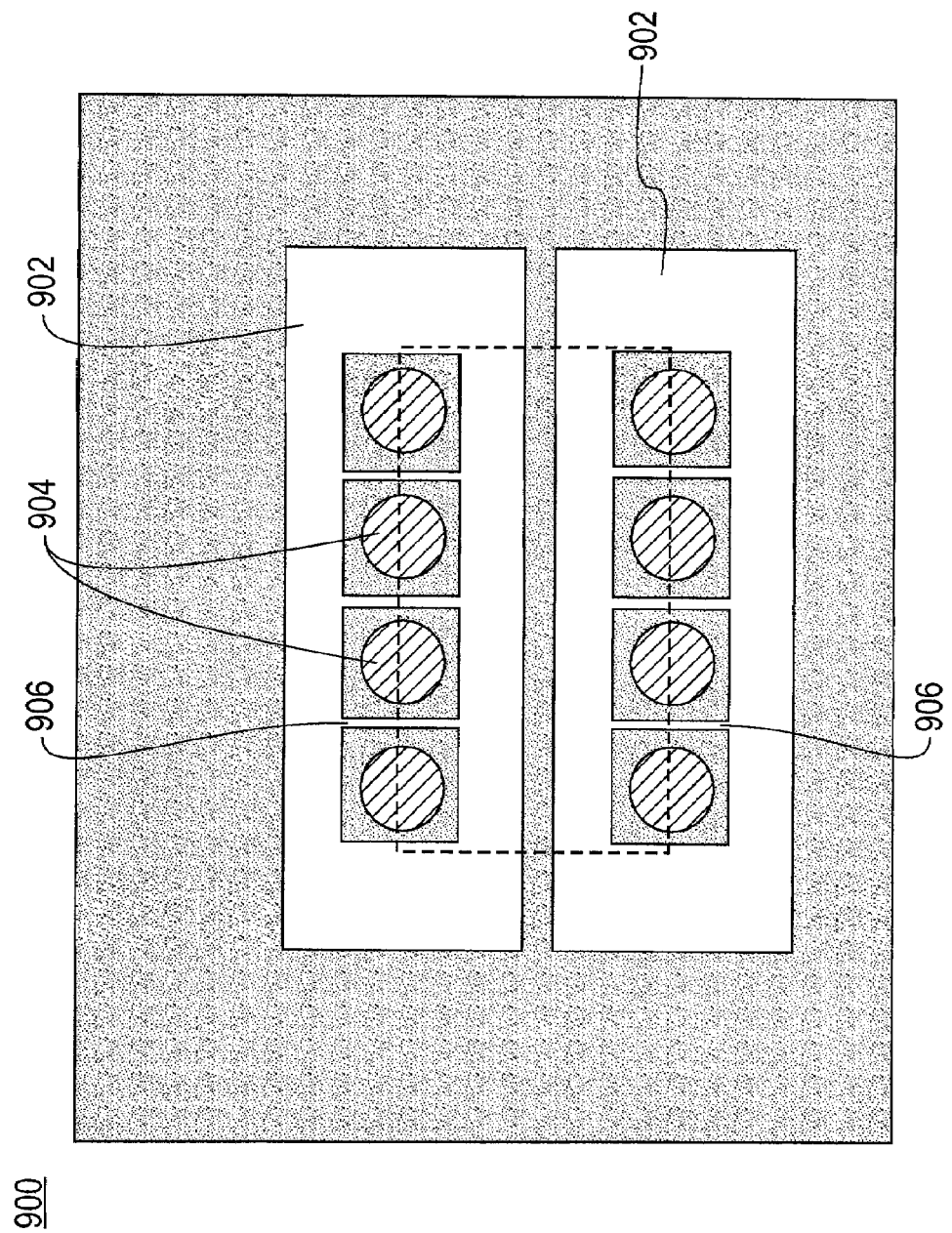
FIG. 9 illustrates a second trench design in accordance with an exemplary embodiment of the present invention.

FIG. 9 illustrates an alternative trench design in accordance with certain exemplary embodiments of the present invention. The trench design depicted in FIG. 9 also includes a continuous trench 902 formed around each row of solder joints 904. Additionally, the trench 902 includes trench extension slits 906 formed between each of the solder joints 904. The trench extension slits 906 further reduce the stiffness of the substrate, thus, further reducing the stress on the solder joints 904.

Figure 10:
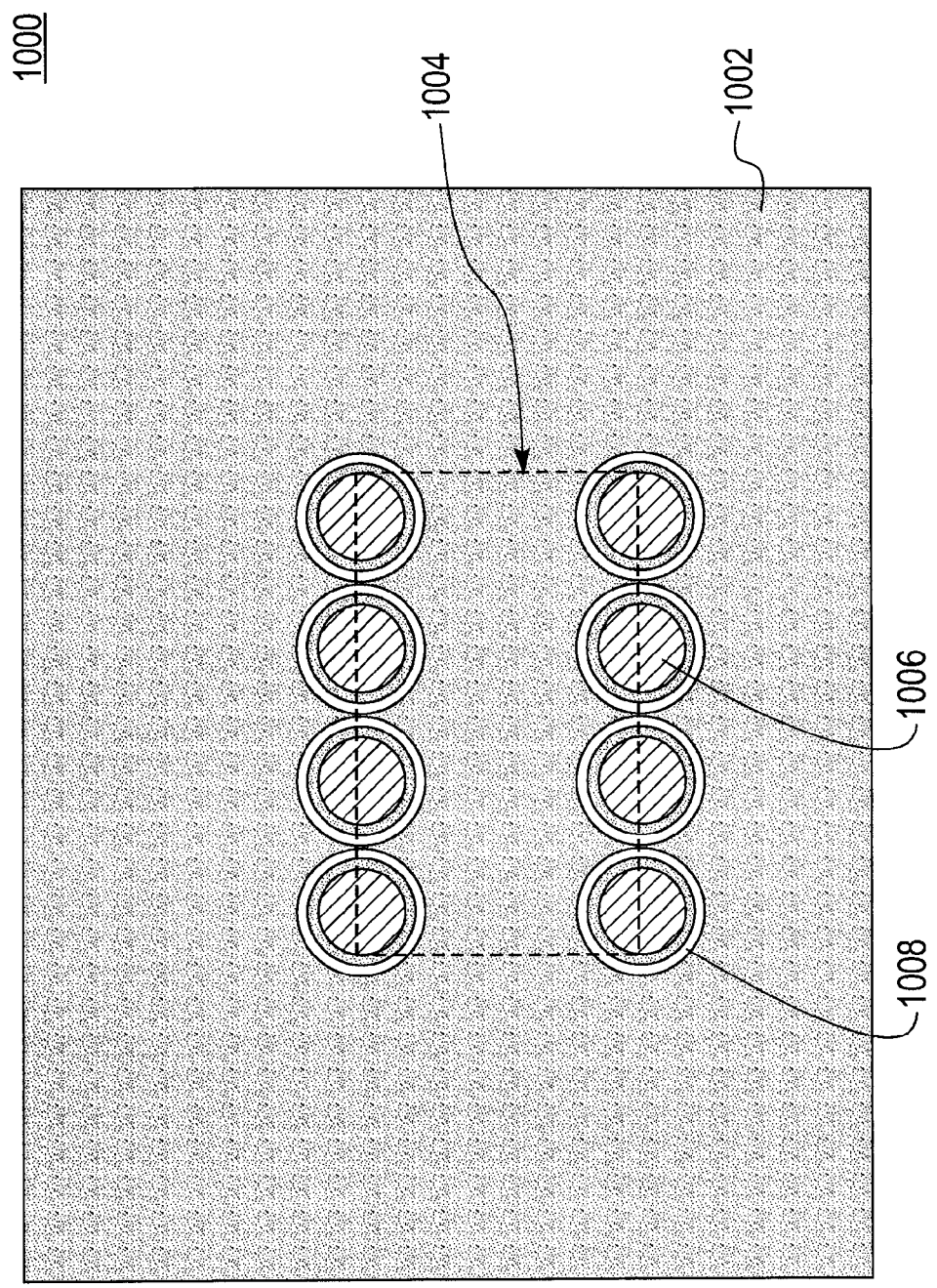
FIG. 10 illustrates a third trench design in accordance with an exemplary embodiment of the present invention.

FIG. 10 illustrates another alternative embodiment of the present invention. Similarly to the embodiments described above, the electronic module 1000 includes a capacitor 1004 mounted to a substrate 1002 by a plurality of capacitor legs 1006. In accordance with the present embodiment, an individual trench 1008 is formed around each of the individual capacitor legs 1006. The trenches 1008 have a shape similar to the shape of the capacitor legs. In the embodiment illustrated in FIG. 10, the trenches have a circular shape.

While the invention has been described in terms of several exemplary embodiments, those skilled in the art will recognize that the invention can be practiced with modification within the spirit and scope of the appended claims.

Further, it is noted that, Applicants' intent is to encompass equivalents of all claim elements, even if amended later during prosecution.

What is claimed is:

1. An electronic module, comprising:
a substrate having at least one structure that reduces stress flow through the substrate; and
an electronic component mounted on the substrate,
wherein said structure comprises at least one trench in a surface of the substrate,
wherein said at least one trench is formed around a plurality of capacitor legs, said capacitor legs mounting the electronic component to the substrate,
wherein said at least one trench comprises a plurality of trench extension slits extending from each of said trenches and extending between the plurality of capacitor legs.

2. The electronic module in accordance with claim 1, wherein said at least one trench comprises:
a first trench formed around a first row of capacitor legs; and
a second trench formed around a second row of capacitor legs.

3. The electronic module in accordance with claim 1, wherein the at least one trench comprises one of a plurality of trenches in said surface of said substrate.

4. The electronic module in accordance with claim 3, wherein said plurality of trenches comprises a plurality of individual trenches, said individual trenches being formed around a plurality of capacitor legs.

5. The electronic module in accordance with claim 1, wherein the at least one trench comprises a continuous trench.

6. The electronic module in accordance with claim 1, wherein the at least one trench has a depth of approximately 15 µm or greater.

7. The electronic module in accordance with claim 1, wherein the at least one trench has a width of approximately 200 µm.

8. The electronic module in accordance with claim 1, wherein the electronic component is mounted on a top surface of the substrate.

9. The electronic module in accordance with claim 1, wherein the electronic component is mounted above a top surface of said substrate.

10. The electronic module in accordance with claim 1, wherein the plurality of capacitor legs are disposed on a top surface of the substrate.

11. The electronic module in accordance with claim 1, wherein the plurality of capacitor legs are disposed between a top surface of the substrate and the electronic component.

12. The electronic module in accordance with claim 1, wherein the at least one trench is formed in a top surface of the substrate.

13. An electronic module, comprising:
a substrate;
an electronic component mounted above the substrate;
a plurality of capacitor legs, the capacitor legs mounting the electronic component to the substrate; and
at least one trench in a surface of the substrate, the at least one trench being formed around the plurality of capacitor legs.

14. The electronic module in accordance with claim 13, wherein the plurality of capacitor legs are disposed between a top surface of the substrate and the electronic component.

15. The electronic module in accordance with claim 13, wherein the at least one trench is formed in a top surface of the substrate.

16. The electronic module in accordance with claim 13, wherein the at least one trench comprises one of a plurality of trenches in said surface of said substrate.

17. An electronic module, comprising:
a substrate having at least one structure that reduces stress flow through the substrate; and
an electronic component mounted on the substrate,
wherein said structure comprises at least one trench in a surface of the substrate,
wherein said at least one trench is formed around a plurality of capacitor legs, said capacitor legs mounting the electronic component to the substrate.

18. The electronic module in accordance with claim 17, wherein the plurality of capacitor legs are disposed between a top surface of the substrate and the electronic component.

19. The electronic module in accordance with claim 17, wherein the at least one trench is formed in a top surface of the substrate.

20. The electronic module in accordance with claim 17, wherein the at least one trench comprises one of a plurality of trenches in said surface of said substrate.

* * * * *